United States Patent
Onodera et al.

(10) Patent No.: US 9,538,646 B2
(45) Date of Patent: Jan. 3, 2017

(54) THERMOPLASTIC LIQUID CRYSTAL POLYMER FILM, AND LAMINATE AND CIRCUIT BOARD USING SAME

(71) Applicant: KURARAY CO., LTD., Kurashiki-shi (JP)

(72) Inventors: Minoru Onodera, Saijo (JP); Tatsuya Sunamoto, Saijo (JP); Shuji Matsunaga, Saijo (JP); Takafumi Konno, Saijo (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 14/259,544

(22) Filed: Apr. 23, 2014

(65) Prior Publication Data

US 2014/0231123 A1    Aug. 21, 2014

Related U.S. Application Data

(63) Continuation of application No. PCT/JP2012/076086, filed on Oct. 9, 2012.

(30) Foreign Application Priority Data

Oct. 31, 2011  (JP) ................................. 2011-238323

(51) Int. Cl.
*H05K 1/03* (2006.01)
*H05K 3/46* (2006.01)
(Continued)

(52) U.S. Cl.
CPC ............. *H05K 1/0313* (2013.01); *B32B 15/08* (2013.01); *B32B 15/09* (2013.01); *B32B 15/20* (2013.01);
(Continued)

(58) Field of Classification Search
CPC ..... H05K 1/0313; H05K 1/032; H05K 3/4626
See application file for complete search history.

(56) References Cited

U.S. PATENT DOCUMENTS 6,274,242 B1    8/2001  Onodera et al.
6,334,922 B1    1/2002  Tanaka et al.
(Continued)

FOREIGN PATENT DOCUMENTS

JP    11-309803     11/1999
JP    2000-263577    9/2000
(Continued)

OTHER PUBLICATIONS

Sunamoto, Machine Translation of JP2006137786, Jun. 1, 2006.*
(Continued)

*Primary Examiner* — Jeremy C Norris
(74) *Attorney, Agent, or Firm* — Oblon, McClelland, Maier & Neustadt, L.L.P.

(57) ABSTRACT

To provide a thermoplastic liquid crystal polymer film capable of suppressing change in relative dielectric constant before and after heating, and a laminated and a circuit board using the same. In this film, a change ratio of a dielectric constant ($\in_{r2}$) of the film after heating to a dielectric constant ($\in_{r1}$) of the film before the heating satisfies the following formula (I) where the film is heated for 1 hour at a temperature in a range from a temperature being 30° C. lower than a melting point of the film to a temperature being 10° C. higher than the melting point, $$|\in_{r2}-\in_{r1}|/\in_{r1}\times 100 \leq 5 \tag{I}$$

where $\in_{r1}$ denotes the relative dielectric constant before the heating, $\in_{r2}$ denotes the relative dielectric constant (Continued)

after the heating. These relative dielectric constants are measured at the same frequency in a range of 1 to 100 GHz.

14 Claims, 1 Drawing Sheet

(51) Int. Cl.
| | |
|---|---|
| C08J 5/18 | (2006.01) |
| B32B 37/06 | (2006.01) |
| C09K 19/38 | (2006.01) |
| B32B 15/09 | (2006.01) |
| B32B 37/18 | (2006.01) |
| B32B 15/08 | (2006.01) |
| B32B 15/20 | (2006.01) |
| B32B 27/20 | (2006.01) |
| B32B 27/28 | (2006.01) |
| B32B 27/32 | (2006.01) |
| B32B 27/34 | (2006.01) |
| B32B 27/36 | (2006.01) |
| B32B 37/10 | (2006.01) |
| H05K 1/02 | (2006.01) |
| H05K 3/02 | (2006.01) |

(52) U.S. Cl.
CPC ............ *B32B 27/20* (2013.01); *B32B 27/286* (2013.01); *B32B 27/32* (2013.01); *B32B 27/322* (2013.01); *B32B 27/34* (2013.01); *B32B 27/36* (2013.01); *B32B 37/06* (2013.01); *B32B 37/182* (2013.01); *C08J 5/18* (2013.01); *C09K 19/3809* (2013.01); *H05K 1/032* (2013.01); *H05K 1/0326* (2013.01); *H05K 3/4626* (2013.01); *B32B 37/10* (2013.01); *B32B 2250/42* (2013.01); *B32B 2305/55* (2013.01); *B32B 2307/202* (2013.01); *B32B 2309/02* (2013.01); *B32B 2309/105* (2013.01); *B32B 2457/00* (2013.01); *C08J 2300/12* (2013.01); *C08J 2367/03* (2013.01); *H05K 1/024* (2013.01); *H05K 3/022* (2013.01); *H05K 2201/0141* (2013.01); *H05K 2203/068* (2013.01); *Y10T 428/31678* (2015.04)

(56) References Cited

U.S. PATENT DOCUMENTS

| | | |
|---|---|---|
| 6,605,324 B1 | 8/2003 | Machida et al. |
| 7,740,790 B2 | 6/2010 | Onodera et al. |

FOREIGN PATENT DOCUMENTS

| | | |
|---|---|---|
| JP | 2006-137786 | 6/2006 |
| JP | 2010-208322 | 9/2010 |
| JP | 2010-229200 | 10/2010 |
| JP | 2011-071815 | 4/2011 |

OTHER PUBLICATIONS

Extended European Search Report issued Feb. 10, 2015 in Patent Application No. 12846753.7.
U.S. Appl. No. 14/500,306, filed Sep. 29, 2014, Konno, et al.
U.S. Appl. No. 14/662,580, filed Mar. 19, 2015, Onodera, et al.
International Search Report issued Jan. 15, 2013 in PCT/JP2012/076086 filed Oct. 9, 2012.
English translation of the International Preliminary Report on Patentability and Written Opinion issued May 15, 2014, in PCT/JP2012/076086 filed Oct. 9, 2012.
Communication pursuant to Article 114(2) EPC issued Dec. 7, 2015 on European patent application No. 12846753.7.
Communication pursuant to Article 94(3) EPC issued Dec. 16, 2015 on European patent application No. 12846753.7.
Notification issued Nov. 24. 2015 on Japanese patent application No. 2013-541688 with English translation.
Third Party Submission. Comments regarding materiality of documents with regard to U.S. Appl. No. 14/259,544.
Notification of Reason(s) for Rejection issued Jan. 19, 2016, in corresponding Japanese patent Application No. 2013-541688 (with English-language Translation).
Notification issued Jun. 21, 2016 in Japanese Patent Application No. 2013-541688 (with partial English translation).
"The Japanese Pharmacopeia-Description 12th Edition" Hirokawa Shoten Co., 1991, p. A-41 and Cover Page (with partial English translation).
Michinori Oki, et al., "Encyclopedic Dictionary of Chemistry" Tokyo Kagaku Dojin, 1989, p. 2396 and Cover Pages (with partial English translation).
Decision of Rejection issued Oct. 4, 2016, in corresponding Japanese Patent Application No. 2013-541688 (with English summary).

\* cited by examiner

Fig. 1

Fig. 2

THERMOPLASTIC LIQUID CRYSTAL POLYMER FILM, AND LAMINATE AND CIRCUIT BOARD USING SAME

CROSS REFERENCE TO THE RELATED APPLICATION

This application is a continuation application, under 35 U.S.C. §111(a), of international application No. PCT/JP2012/076086, filed Oct. 9, 2012, which claims priority to Japanese Patent Application No. 2011-238323 filed on Oct. 31, 2011 in Japan, the entire disclosure of which is herein incorporated by reference as a part of this application.

FIELD OF THE INVENTION

The present invention relates to a thermoplastic liquid crystal polymer film in which change in a relative dielectric constant before and after heating the film can be suppressed, and a laminated body and a circuit board using the same thermoplastic liquid crystal polymer film.

BACKGROUND ART

Recently, there have been remarkable developments in the field of information processing (e.g., a field of personal computer) and the field of wireless communication (e.g., a field of cellular phone). Improvement of signal transmission speed of a board and realization of low transmission loss in a high-frequency region are required in order to improve information processing speed in these fields. Signal-transmission speed increases as the dielectric constant is low. In addition, since waveform distortion becomes smaller as the dielectric constant becomes lower, development of a high-frequency circuit board having a low dielectric constant has been investigated.

Conventionally, ceramics have been used in these applications. However, ceramics have problems in that ceramics are difficult to work and expensive. Therefore, there have been demands for easily workable and inexpensive organic materials as alternative materials for ceramics. For example, as applications of organic materials, there have been proposed an use of a fluorine resin having excellent dielectric property as an electric insulator of a board (hereinafter, referred to as a "PTFE board") or an use of polyimide having excellent heat resistance as an electric insulation layer of a board (hereinafter, referred to as a "PI board").

In the PTFE board, the fluorine resin itself has excellent high-frequency property and moisture resistance. However, high-frequency property and moisture resistance of the entire board is low due to influence of a glass fiber cloth and the like used for improving dimensional stability. High-frequency property of the PI board is remarkably inferior to that of the PTFE board. In addition, the PI board has high hygroscopicity, and therefore, the high-frequency property is significantly deteriorated by moisture absorption.

Patent Document 1 (JP Laid-open Patent Publication No. H11-309803) discloses a multilayer laminated plate, a method for producing the same, and a multilayer mounting circuit board.

This Document discloses a multilayer laminated plate comprising a plurality of laminated bodies bonded by thermo-compression bonding, wherein a film produced from a polymer that can form an optically anisotropic melt phase and a support body are laminated in each laminated body. Where two adjacent laminated bodies are disposed in such a state that a support body of one laminated body faces a support body of the other laminated body, the two laminated bodies are bonded with an intermediate sheet in between. The intermediate sheet is made of a film produced from a polymer that can form an optically anisotropic melt phase. The film of the laminated body and the intermediate sheet have the same chemical composition, whereas adjacent film and the intermediate sheet are provided with different heat resistance.

Patent Document 2 (JP Laid-open Patent Publication No. 2000-263577) discloses a method for producing a metal foil laminated plate and the metal foil laminated plate.

This document discloses a method for producing a metal foil laminated plate, overlapping constituent materials composed of a film made of a thermoplastic polymer that can form an optically anisotropic melt phase (hereinafter, this is referred to as a "thermoplastic liquid crystal polymer film") and a metal foil, sandwiching the film and the metal foil by two flat metal plates to form a unit laminate, stacking a plurality of sets of the unit laminate to form a stacked body, disposing the stacked body between opposed press heating plates, and forming the metal foil laminated plate by a process including hot-pressing the stacked body, wherein the process includes (1) a first step (preliminary heating step) of heating the stacked body to a preliminary heating temperature that is at most 30° C. lower than a melting point of thermoplastic liquid crystal polymer film without pressurizing the stacked body, (2) a second step (temperature elevation step) of heating the stacked body from the preliminary heating temperature to a laminating temperature selected from a range between a lower limit being 5° C. lower than the melting point of the thermoplastic liquid crystal polymer film and an upper limit being 5° C. higher than the melting point while pressurizing the stacked boy with a pressure maintained at 2 kg/cm² or less, (3) a third step (pressurizing step) of pressurizing the stacked body with a pressure selected from the range of 20 kg/cm² to 50 kg/cm² at the laminating temperature, and (4) a fourth step (cooling step) of cooling the stacked body to a cooling temperature at least 30° C. lower than the melting point of the thermoplastic liquid crystal polymer film while maintaining the pressure of the pressurizing step, wherein the second step to the fourth step are performed within 30 minutes, and the first step to the fourth step are performed under a vacuum condition of 30 torr or less, and a metal foil laminated film is unloaded in a fifth step (ejection step) after releasing the compression and vacuum condition.

PATENT DOCUMENT

[Patent Document 1] JP Laid-open Patent Publication No. H11-309803
[Patent Document 2] JP Laid-open Patent Publication No. 2000-263577

SUMMARY OF THE INVENTION

Problem to be Solved by the Invention

In some cases, circuits made from the multilayer laminated plate or the metal foil laminated plate disclosed in the above-described Patent Documents have showed inconsistence between designed value and real performance of the circuits. In such a case, repeated trial production of the circuit has been required.

An object of the present invention is to provide a thermoplastic liquid crystal polymer film in which change in dielectric characteristics can be suppressed even when the film is heated.

In addition to the above objective, another objective of the present invention is to provide a thermoplastic liquid crystal polymer film that exerts excellent dielectric properties even when temperature and moisture environments are changed, particularly when the film is exposed to high temperature and/or high humidity conditions.

Another object of the present invention is to provide a laminated body and a circuit board utilizing the thermoplastic liquid crystal polymer film.

Another objective of the present invention is to provide a method for effectively producing this laminated body or circuit board.

Solution of the Problems

As a result of intensive research to achieve the above described objectives, the inventors found that (i) dielectric properties achieved by a thermoplastic liquid crystal polymer film may change depending on temperature and/or electric filed, and this phenomenon is caused by melt-extrusion film formation in which liquid crystal polymer molecules are highly oriented with anisotropic layered structure, and that (ii) a board utilizing a thermoplastic liquid crystal polymer film shows remarkable difference in electric properties from designed value after processing the circuits due to the thermoplastic property of the polymer film that causes change of molecular orientation depending on heat and stress loaded until the circuit processing. As a result of further conducting research, the inventors have further studied a relationship between the molecular structure of the liquid crystal polymer and dielectric properties thereof in detail, and have succeeded in production of a film having a structure showing little change depending on temperature and electric field. Specifically, the inventors have found that, by combining specific steps in the production of thermoplastic liquid crystal polymer film, it is possible to change the liquid crystal domain structure of the thermoplastic liquid crystal polymer film, thereby suppressing mobility of molecules during heat treatment and reducing the change of dielectric properties due to change of temperature and/or moisture absorption. Based on these findings, the inventors have accomplished the present invention.

An aspect of the present invention is a liquid crystal polymer film made of a thermoplastic polymer capable of forming an optically anisotropic melt phase (hereinafter, referred to as a thermoplastic liquid crystal polymer film), wherein a change ratio of a relative dielectric constant ($\in_{r2}$) of the film after heating of the film to a relative dielectric constant ($\in_{r1}$) of the film before the heating satisfies the following formula (I) where the film is heated for 1 hour at a temperature in a range from a temperature being 30° C. lower than a melting point of the film to a temperature being 10° C. higher than the melting point in the heating, $$|\in_{r2} - \in_{r1}|/\in_{r1} \times 100 \leq 5 \tag{I}$$

where $\in_{r1}$ denotes the relative dielectric constant before the heating, $\in_{r2}$ denotes the relative dielectric constant after the heating, and these relative dielectric constants are measured at the same frequency in a range of 1 to 100 GHz.

The above-described liquid crystal polymer film may have a relative dielectric constant ($\in_{r2}$) after the heating of about 2.6 to 3.5. A dielectric loss tangent (Tan $\delta_2$) of the film may be about 0.001 to 0.01. These values may be measured at a temperature in a range from −100° C. to 100° C. The liquid crystal polymer film may show the above-described values of relative dielectric constant ($\in_{r2}$) and dielectric loss tangent (Tan $\delta_2$) after exposing the film to conditions of 25° C., 50% RH and 85° C., 85% RH.

Aspects of the present invention may include a method of producing the above-described liquid crystal polymer film. The method of producing a thermoplastic liquid crystal polymer film at least comprises:

(I) performing melt extrusion of a thermoplastic liquid crystal polymer while controlling a shear velocity of the thermoplastic liquid crystal polymer in a die region to be 200 sec$^{-1}$ or higher during extruding a melt of the polymer through the die;

(II) drawing the extruded polymer to obtain a raw film while controlling a ratio (Br/Dr) of drawing ratio (blow ratio: Br) of the polymer in transverse direction (TD direction) to drawing ratio (draw ration: Dr) of the polymer in machine direction (MD direction) to be 1.5 to 5;

(III) heat-shrinking the raw film after the extrusion and drawing steps by 1.5% or more under a presence of tensile force;

(IV) laminating the heat-shrunk film on a support body (adherend) to form a composite to control a thermal expansion coefficient of the film, and subsequently heat treating the composite at a temperature ranging from a temperature (Tm−10° C.) being 10° C. lower than a melting point (Tm) of the film to a temperature (Tm+10° C.) being 10° C. higher than the melting point of the film to increase a heat distortion temperature (Td) of the film;

(V) performing annealing of the film delaminated from the support body after the heat treatment, the annealing being performed by heating the film at a temperature in a range from a temperature being 80° C. lower than the heat distortion temperature (Td) of the raw film, i.e., (Td−80)° C. to a temperature being 10° C. lower than Td, i.e., (Td−10)° C.

Aspects of the present invention include a laminate (laminated or layered body) comprising at least one film layer made of the above-described thermoplastic liquid crystal polymer film and at least one metal layer, wherein the laminate has a laminated structure in which the film layer and the metal layer are laminated alternately.

In the above-described laminate, it is possible to use an ultra-low-profile metal foil. For example, a surface roughness of the metal layer may be one fiftieth (1/50) or less of a thickness of the film.

Aspects of the present invention include a circuit board comprising at least the above-described thermoplastic liquid crystal polymer film and a conductor circuit layer formed on at least one surface of the thermoplastic liquid crystal polymer film. The circuit board may have a plurality of conductor circuit layers.

Aspects of the present invention include a method of producing a laminate, comprising:

(i) preparing a metal laminated film in which a metal layer thermocompressively bonded to at least one surface of the liquid crystal polymer film according to any one of claims 1 to 4;

(ii) preparing at least one set of a board set (board unit) in which a plurality of the metal laminated films are overlaid such that a metal layer and a polymer film layer are alternately laminated, or at least one metal laminated film and at least one thermoplastic liquid crystal polymer film are overlaid such that a metal layer and a polymer film layer are alternately laminated; and loading the board set between two heat pressing plates opposed to each other; and (iii) heating the heat pressing plates to bond the layers of the loaded board set by thermocompression bonding,
wherein the heat pressing plates each have a microconvex part for absorbing thermal expansion of the metal layer.

In the above-described method of producing laminate, the microconvex part formed in each of the heat pressing plates at the side facing the board set may increases its height from the edge of the plate to a center of the plate and has a height of 10 to 500 μm at the center of the plate.

It should be noted that the MD direction denotes the machine direction of a film, and the TD direction denotes the direction which intersects perpendicularly with this direction.

Effect of the Invention

According to the present invention, since a liquid crystal polymer film has a controlled liquid crystal domain structure, even if the film is a thermoplastic film, the film can stabilize dielectric characteristics between before and after heating the film.

Excellent dielectric properties of the liquid crystal polymer film can be maintained in the above-described film irrespective of change of thermal and/or moisture environment, specifically, even when the film is exposed to high temperature and/or high humidity conditions.

According to the present invention, a laminate and a circuit board both of which retain excellent dielectric properties even after thermocompression bonding can be provided efficiently by the use of thermocompression apparatus having heat pressing plates of specific constitution.

BRIEF DESCRIPTION OF THE DRAWINGS

The present invention will be more clearly understood from the following description of preferred embodiments thereof with reference to accompanying drawings. However, the description of embodiments and the drawings are given only for the purpose of illustration and explanation of the invention, and should not be taken as limiting the scope of the present invention. The scope of the present invention is to be determined by the appended claims.

DESCRIPTION OF EMBODIMENTS

A thermoplastic liquid crystal polymer film according to the present invention is a thermoplastic liquid crystal polymer film, wherein a change ratio of a relative dielectric constant ($\in_{r2}$) of the film after heating of the film to a relative dielectric constant ($\in_{r1}$) of the film before the heating satisfies the following formula (I) where the film is heated for 1 hour at a temperature in a range from a temperature being 20° C. lower than a melting point of the film to a temperature being 20° C. higher than the melting point in the heating, $$|\in_{r2}-\in_{r1}|/\in_{r1}\times 100 \leq 5 \quad (I)$$

where $\in_{r1}$ denotes the relative dielectric constant before the heating, $\in_{r2}$ denotes the relative dielectric constant after the heating, and these relative dielectric constants are measured at the same frequency in a range of 1 to 100 GHz.

(Thermoplastic Liquid Crystal Polymer)

The thermoplastic liquid crystal polymer film is constituted of a liquid crystalline polymer (or a polymer capable of forming an optically anisotropic melt phase) that is processable in a molten state. Although chemical formulation of the thermoplastic liquid crystal polymer is not particularly limited to a specific one as long as the liquid crystalline polymer can be worked in molten state, examples of the polymer may include a thermoplastic liquid crystal polyester, or a thermoplastic liquid crystal polyester amide obtained by introducing an amide bond thereto.

The thermoplastic liquid crystal polymer may be a polymer obtained by further introducing an imide bond, a carbonate bond, a carbodiimide bond, or an isocyanate-derived bond such as an isocyanurate bond to the aromatic polyester or the aromatic polyester amide.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. In order to form a polymer capable of forming an optically anisotropic melt phase, there is a suitable range regarding the combination of various raw-material compounds.

(1) Aromatic or Aliphatic Dihydroxyl Compounds (see Table 1 for Representative Examples)

TABLE 1

Chemical structural formulae of representative examples of aromatic or aliphatic dihydroxyl compounds X represents a hydrogen atom or a halogen atom, or a group such as a lower alkyl (e.g., $C_{1-3}$ alkyl) or a phenyl

TABLE 1-continued

Chemical structural formulae of representative examples of aromatic or aliphatic dihydroxyl compounds Y represents a group such as —O—, —CH$_2$—, —S—, —CO—, —C(CH$_3$)$_2$—, or —SO$_2$—

HO(CH$_2$)$_n$OH
n is an integer of 2 to 12

(2) Aromatic or Aliphatic Dicarboxylic Acids (see Table 2 for Representative Examples)

TABLE 2

Chemical structural formulae of representative examples of aromatic or aliphatic dicarboxylic acids HOOC(CH$_2$)$_n$COOH
n is an integer of 2 to 12

(3) Aromatic Hydroxycarboxylic Acids (see Table 3 for Representative Examples)

TABLE 3

Chemical structural formulae of representative examples of aromatic or aliphatic hydroxycarboxylic acids X represents a hydrogen atom or a halogen atom, or a group such as a lower alkyl (e.g., C$_{1-3}$ alkyl) or a phenyl

(4) Aromatic Diamines, Aromatic Hydroxy Amines, and Aromatic Aminocarboxylic Acids (see Table 4 for Representative Examples)

TABLE 4

Chemical structural formulae of representative examples of aromatic diamines, aromatic hydroxy amines, or aromatic aminocarboxylic acids

Representative examples of liquid crystal polymers obtained from these raw-material compounds may include copolymers having structural units shown in Tables 5 and 6.

TABLE 5

Representative examples (1) of a thermoplastic liquid crystal polymer (A)  Copolymer

(B)  Copolymer

(C)

Copolymer (D)

Copolymer (E)  Copolymer

(F)

Copolymer

Y is a group such as —O—, —CH$_2$—, or —S—

TABLE 6

Representative examples (2) of thermoplastic liquid crystal polymer (G)

Copolymer (H)

Copolymer

TABLE 6-continued

Representative examples (2) of thermoplastic liquid crystal polymer

Of these copolymers, polymers including at least p-hydroxybenzoic acid and/or 6-hydroxy-2-naphthoic acid as repeating units are preferred. Particularly preferred examples include:

a polymer (i) having repeating units of p-hydroxybenzoic acid and 6-hydroxy-2-naphthoic acid, and a polymer (ii) having repeating units of
at least one aromatic hydroxycarboxylic acid selected from a group consisting of p-hydroxybenzoic acid and 6-hydroxy-2-naphthoic acid,
at least one aromatic diol selected from a group consisting of 4,4'-dihydroxybiphenyl and hydroquinone, and
at least one aromatic dicarboxylic acid selected from a group consisting of terephthalic acid, isophthalic acid, and 2,6-naphthalene dicarboxylic acid.

For example, where the thermoplastic liquid crystal polymer is a polymer (i) at least having repeating units of at least p-hydroxybenzoic acid and 6-hydroxy-2-naphthoic acid, the mole ratio (A)/(B) of p-hydroxybenzoic acid (A) and 6-hydroxy-2-naphthoic acid (B) preferably satisfies (A)/(B)=about 10/90 to about 90/10, more preferably (A)/(B)=about 50/50 to about 85/15, more preferably (A)/(B)=about 60/40 to about 80/20.

Furthermore, where the thermoplastic liquid crystal polymer is a polymer (ii) having repeating units of at least one aromatic hydroxycarboxylic acid (C) selected from a group consisting of p-hydroxybenzoic acid and 6-hydroxy-2-naphthoic acid, at least one aromatic diol (D) selected from a group consisting of 4,4'-dihydroxybiphenyl and hydroquinone, and at least one aromatic dicarboxylic acid (E) selected from a group consisting of terephthalic acid, isophthalic acid, mole ratio of the repeating units may satisfy aromatic hydroxycarboxylic acid (C):aromatic diol (D): aromatic dicarboxylic acid (E)=about 30 to about 80:about 35 to about 10:about 35 to about 10, more preferably (C):(D):(E)=about 35 to about 75:about 32.5 to about 12.5: about 32.5 to about 12.5, and further preferably (C):(D):(E)= about 40 to about 70:about 30 to about 15:about 30 to about 15.

Preferably, mole ratio of a repeating structural unit derived from an aromatic dicarboxylic acid (D) and a repeating structural unit derived from an aromatic diol (E) satisfies (D)/(E)=95/100 to 100/95. Deviation from this range may tend to result in a low degree of polymerization and deterioration in mechanical strength.

For example, optical anisotropy in a molten state described in the present invention can be recognized, for example, by placing a sample on a hot stage, heating the sample with an elevating temperature under nitrogen atmosphere, and observing light transmitting through the sample.

The thermoplastic liquid crystal polymer film may preferably have a melting point (hereinafter, referred to as Tm) in the range of 260 to 360° C., more preferably in the range of 270 to 350° C. Tm may be determined by measuring a temperature at which a main endothermic peak appears in measurement using a differential scanning calorimeter (DSC of Shimadzu Corporation).

As long as the advantageous effect of the present invention is not deteriorated, the above-described thermoplastic liquid crystal polymer may be added with thermoplastic polymer(s), various additive agent(s), filler(s) or the like, where examples of the thermoplastic polymer include a polyethylene terephthalate, a modified polyethylene terephthalate, a polyolefin, a polycarbonate, a polyarylate, a polyamide, a polyphenylene sulfide, a polyester ether ketone, and a fluorine resin.

The thermoplastic liquid crystal polymer film used in the present invention is obtained by extruding the thermoplastic liquid crystal polymer. As long as the direction of rigid rod-like molecules of the thermoplastic liquid crystal polymer is controlled, any known extrusion-molding methods such as a T-die method and a laminate body orientation method can be applied, and an inflation method is particularly preferred.

In the present invention, it is possible to produce a film showing small heat-dependent change in dielectric properties by conducting the following first step to fifth step in combination at the time of extrusion-molding, thereby controlling a molecular structure of the liquid crystal polymer.

(First Step)

In a first step, a thermoplastic liquid crystal polymer is melt-extruded from a die while controlling a shear velocity of the thermoplastic liquid crystal polymer at the time of melt extrusion. At that time, die-shear velocity, that is, the shear velocity of the thermoplastic liquid crystal polymer in the die region (that may simply called a shear velocity) during the melt extrusion of the polymer through the die may be selected from 200 $sec^{-1}$ or higher (for example, about 200 to about 5000 $sec^{-1}$), preferably about 300 to about 4000 $sec^{-1}$ depending on a designed thickness of a film or the like.

(Second Step)

In a second step, drawing ratios of the polymer in longitudinal direction and transvers direction are controlled during the cooling process after the melt extrusion. A sheet of polymer (which may have a cylindrical shape where a ring die is used) melt-extruded from the die is drawn with a predetermined draw ratio (drawing ratio in MD direction) and a predetermined blow ratio (drawing ratio in TD direction). The drawing ratios may be controlled such that a ratio (Br/Dr) of drawing ratio (Br) of the polymer in TD direction to drawing ratio (Dr) of the polymer in MD direction is, for example, 1.5 to 5, preferably about 2.0 to about 4.5.

(Third Step)

In a third step, strain in the film is relaxed by thermally shrinking the film after the extrusion-molding.

At that time, the thermoplastic liquid crystal polymer film is thermally shrunk by 1% or more, preferably thermally shrunk by 1.5% or more in a width direction while applying tensile force (for example, about 2.0 to about 3.0 kg/mm² in the MD direction) to the film. An upper limit of the thermal shrinkage rate is adequately determined depending on films, and usually about 4% in the width direction. A setting temperature of a hot-air drying furnace at the time of thermal shrinkage may be, for example, about 200 to about 290° C. and preferably about 230 to about 270° C.

(Fourth Step)

In a fourth step, molecular weights of liquid crystal domains in the film are increased by further heating the thermally shrunk film at a temperature around the melting temperature. The increase in the molecular weights of the liquid crystal domains can be detected as increase in heat distortion temperature of the film. In this case, the film is once thermally treated as a composite made by laminating the film with a support body (for example, a metal foil such as a copper foil or an aluminum foil) that can maintain the form of the film during heat-treatment of the film. Adhesion of the film and the support body is usually conducted by thermocompression bonding, for example, using a hot press or a hot roll machine. This composite is thermally treated so that a thermal expansion coefficient of the film is almost equal to a thermal expansion coefficient of the support body (for example, about $16 \times 10^{-6}$ cm/cm/° C. to about $26 \times 10^{-6}$ cm/cm/° C.), and thereafter, is heated at a temperature around the melting point (Tm) of the film, that is, within a range of Tm−30 (° C.) to Tm+10 (° C.), and preferably within a range of Tm−25 (° C.) to Tm+5 (° C.) for about 4 to about 12 hours, preferably about 5 to about 10 hours. As a result, a heat distortion temperature of the film is increased, for example, about 40 to about 80° C., preferably about 50 to about 60° C. compared with the heat distortion temperature of the original film.

(Fifth Step)

In a fifth step, internal strain of the obtained film is relaxed by annealing treatment. Specifically, after the film is delaminated from the support body, the thermoplastic liquid crystal polymer film is continuously fed to a hot-air drying furnace that is controlled at a temperature from a temperature (Td−90° C.) being 90° C. lower than the heat distortion temperature (Td) of the film to a temperature (Td−10° C.) being 10° C. lower than the heat distortion temperature of the film, and the film is thermally treated for about 5 seconds to about 60 seconds to remove the internal strain by about 0.3 to about 3% and preferably about 0.5 to about 2.5%.

In the thus obtained thermoplastic liquid crystal polymer film of the present invention, change of molecular orientation before and after heating can be suppressed even though the film is made of a thermoplastic polymer. Therefore a change ratio of a relative dielectric constant after heating the film ($\in_{r2}$) to a relative dielectric constant before heating the film ($\in_{r1}$) at a frequency of high frequency region ranging from 1 to 100 GHz is controlled to be 5% or less.

The thermoplastic liquid crystal polymer film of the present invention satisfies the following formula (I) with respect to the relative dielectric constant before and after heating the film where the film is heated at a temperature in a range from a temperature being 30° C. lower than the melting point of the film to a temperature being 10° C. higher than the melting point for, for example, at least 1 hour (for example, 2 hours).

$$|\in_{r2} - \in_{r1}|/\in_{r1} \times 100 \leq 5 \qquad (I)$$

where $\in_{r1}$ is a relative dielectric constant before heating the film; $\in_{r2}$ is a relative dielectric constant $\in_{r2}$ after heating the film; and these relative dielectric constants are measured at the same frequency in a range of 1 to 100 GHz.

Here, the relative dielectric constant is a value measured by a method described in Example described below.

Preferably, in a frequency in a range of 1 to 100 GHz, the relative dielectric constant ($\in_{r2}$) of the thermoplastic liquid crystal polymer film after the heating may be, for example, 2.6 to 3.5, and more preferably 2.6 to 3.4.

In addition, in a frequency in a range of 1 to 100 GHz, a dielectric loss tangent (Tan $\delta_2$) of the thermoplastic liquid crystal polymer film after the heating may be, for example, 0.001 to 0.01 and more preferably 0.001 to 0.008.

Preferably, both of the relative dielectric constant ($\in_{r2}$) and the dielectric loss tangent (Tan $\delta_2$) of the thermoplastic liquid crystal polymer film after the heating may indicate the above-describes values at a temperature of measurement in the range of −100 to 100° C.

Preferably, both of the relative dielectric constant ($\in_{r2}$) and the dielectric loss tangent (Tan $\delta_2$) of the thermoplastic liquid crystal polymer film after the heating may show the above values after exposing the thermoplastic liquid crystal polymer film to conditions of 25° C., 50% RH and 85° C., 85% RH.

The thermoplastic liquid crystal polymer film used in the present invention may have arbitrary thickness and may include plate-like or sheet-like film having a thickness of 5 mm or less. Where the film is used for a high-frequency electrical transmission line, the thickness should be as thick as possible since transmission loss decreases with increasing thickness of the film. Where the thermoplastic liquid crystal polymer film is used as a single body constituting an electric insulation layer, the thickness of the film is preferably within a range of 10 to 500 μm and more preferably within a range of 15 to 200 μm. Since a film having too small thickness has low rigidity and low strength, it is possible to achieve a desired thickness by laminating the films having a thickness in a range of 10 to 200 μm.

(Laminate)

The laminate of the present invention includes at least one film layer made of the above-described thermoplastic polymer film and at least one metal layer, and has a laminated structure in which the film layer and the metal layer are laminated alternately. Where a plurality of film layers exist, the thermoplastic polymer films forming each film layer may be films having the same melting point or may be films having different melting points.

The laminate can be prepared by bonding the metal layer to at least one surface of the thermoplastic polymer film by thermocompression. The laminate may be a single layer laminate that includes a metal layer as a single layer or may be a multilayer (plural-layer) laminate that includes a plurality of metal layers.

The metal used in the metal layer is preferably a metal used for electric connection. For example, the metal may be selected from copper, gold, silver, nickel, and aluminum, where copper is particularly preferred. A thickness of the metal layer is preferably within a range of 1 to 50 μm, more preferably within a range of 5 to 20 μm.

In addition, the thermoplastic liquid crystal polymer film of the present invention can be directly bonded to an ultra-low profile metal by thermocompression. A surface roughness of such a metal layer may be 1/50 or less, preferably 1/60 or less, more preferably 1/70 or less of the film thickness in a surface facing to the film. In addition, specific surface roughness may be, for example, 5 μm or less and preferably 3 μm or less.

In the present invention, the laminate can maintain low dielectric properties originated from the dielectric properties of the above-described thermoplastic liquid crystal polymer film even after the metal layer and the thermoplastic liquid crystal polymer film are laminated by the thermocompression bonding. For example, a change ratio of a relative dielectric constant ($\epsilon_{r3}$) of the laminate after thermocompression bonding to a relative dielectric constant ($\epsilon_{r1}$) of the film before the thermocompression bonding satisfies the following formula (II).

$$|\epsilon_{r3}-\epsilon_{r1}|/\epsilon_{r1}\times 100 \leq 5 \qquad (II),$$

where $\epsilon_{r1}$ is a relative dielectric constant of the film before thermocompression bonding, $\epsilon_{r3}$ is a relative dielectric constant of the laminate after bonding the film and the metal layer by thermocompression bonding, and these relative dielectric constants are measured at the same frequency in a range of 1 to 100 GHz.

Here, the relative dielectric constant is a value measured by a method described in Example described below.

Preferably, at a frequency in a range of 1 to 100 GHz, the relative dielectric constant ($\epsilon_{r3}$) of the laminate after thermocompression bonding may be, for example, 2.6 to 3.5 and more preferably 2.6 to 3.4.

At a frequency in a range 1 to 100 GHz, a dielectric loss tangent (Tan $\delta_3$) of the laminate after thermocompression bonding may be, for example, 0.001 to 0.01 and more preferably 0.001 to 0.008.

Preferably, both of the relative dielectric constant ($\epsilon_{r3}$) and the dielectric loss tangent (Tan $\delta_3$) of the laminate after thermocompression bonding may show the above values at a measurement temperature in a range of −100 to 100° C.

Preferably, both of the relative dielectric constant ($\epsilon_{r3}$) and the dielectric loss tangent (Tan $\delta_3$) of the laminate after thermocompression bonding may show the above values after exposing the laminate to conditions of 25° C., 50% RH and 85° C., 85% RH.

The above-described laminate can be produced by using a thermocompression bonding method, for example, using a hot press or a hot rolling machine as long as the dielectric characteristics of the thermoplastic liquid crystal polymer film are not changed. In the present invention, the inventors have found a new method for effectively producing the laminate or a circuit board.

That is, the method of producing a laminate comprises:
(i) preparing a metal laminated film in which a metal layer thermocompressively bonded to at least one surface of the liquid crystal polymer film (metal laminated film preparation step);

(ii) preparing at least one set of a board set in which
a plurality of the metal laminated films are overlaid such that a metal layer and a polymer film layer are alternately laminated, or
at least one metal laminated film and at least one thermoplastic liquid crystal polymer film are overlaid such that a metal layer and a polymer film layer are alternately laminated; and
loading the board set between two heat pressing plates opposed to each other (board set loading step); and
(iii) heating the heat pressing plates to bond the layers of the loaded board set by thermocompression bonding (bonding step),
wherein the heat pressing plates have a microconvex part for absorbing thermal expansion of the metal layer.

In the above-described production method, since the heat pressing plates have the microconvex parts for absorbing thermal expansion of the metal layer, it is possible to avoid a use of the member for absorbing thermal expansion of the metal layer which has been conventionally an essential member in the heat pressing process using heat pressing plates. As a result, heat conductivity at the time of the hot press can be improved and cycle time of the hot press can be remarkably shortened compared to a conventional method.

The microconvex part can be appropriately provided depending on a thermal expansion coefficient of the metal layer. For example, depending on the thermal expansion coefficient of the metal layer, the microconvex part may be a smooth convex part having a height increasing from an edge to a center of the heat pressing plates at the side facing the board set, and the height of the convex part in the center part may be, for example, about 10 to about 500 μm, more preferably about 100 to about 200 μm.

The production method of the laminate can be effectively applied to the specific thermoplastic liquid crystal polymer film of the present invention. In addition the method can also be effectively applied to a conventionally used commercially available thermoplastic liquid crystal polymer film (for example, VECSTAR series available from KURARAY CO., LTD.) in order to shorten the duration of heat pressing cycle.

(Circuit Board)

The circuit board includes at least the thermoplastic liquid crystal polymer film and a conductor circuit layer formed on at least one surface of the thermoplastic liquid crystal polymer film.

The conductor circuit can be formed according to known methods. Specific examples include (a) a method for forming a conductor circuit by laminating the thermoplastic liquid crystal polymer film and the metal layer by thermocompression bonding, and thereafter, applying etching treatment and the like, and (b) a method for forming the conductor circuit by forming a conductor layer on the surface of the thermoplastic liquid crystal polymer film by a vapor phase method such as a sputtering method, an ion-plating method, and an vacuum evaporation method or a wet type plating method.

As a metal material used for forming the metal layer (or the conductor circuit layer), the various metals described in the above explanation of the metal layer can be used.

In addition, the method for producing the laminate can be applied as a method for producing a circuit board. In this case, the circuit board can be produced in a similar manner as the production method described above except that a metal layer in the metal laminated film is subjected to patterning as needed.

The circuit board may be a single circuit layer board including a single metal layer (or a single conductor circuit layer). However, a multilayer circuit board (for example, a two-layer circuit board, three-layer circuit board, a four-layer circuit board, and the like) including a plurality of metal layers (or a plurality of conductor circuit layers) is preferable in order to satisfy requirement for a high performance of a circuit board. In this case, the metal layer (that is patterned where necessary) in the circuit board is used as a signal line having a predetermined pattern or a ground plane line.

Since the circuit board has the stable relative dielectric constant even at a high-frequency region before and after heating, the circuit board can be used as a high frequency circuit board. Examples of the high-frequency circuit board are not limited to a circuit board having a circuit that only transmits high-frequency signals. For example, in the same plane of the high-frequency circuit, the circuit board may have a transmission line for transmitting signals other than the high-frequency signals, for example, a transmission line for converting high frequency signals to low-frequency signals and outputting generated low-frequency signals to external part, and/or a transmission line for supplying electric power for driving high-frequency components.

Examples of the above-described transmission channels include various transmission channels, for example, well-known or commonly used transmission channels such as a coaxial line channel, a stripe line channel, a microstripe line channel, a coplanar line channel, and a parallel line channel.

EXAMPLES

In the following, the present invention will be described in more detail based on Examples. It should be noted that the present invention is not limited to these Examples. In the following Examples and Comparative Examples, physical properties were measured with the method described below.

[Melting Point]

Melting point of a film was determined based on the observation of thermal behavior of the film using a differential scanning calorimeter. A test film was heated at a rate of 20° C./min to completely melting the film, and the melt was rapidly cooled to 50° C. at a rate of 50° C./min. Subsequently, the quenched material was reheated at a heating rate of 20° C./minute, and a position of an endothermic peak appearing in the reheating process was recorded as a melting point of the film.

[Thermal Shrinkage Ratio]

Dimensions of the test sample before and after thermal shrinkage were measured with a set of vernier calipers, and the thermal shrinkage rate was calculated according to the following formula:

$$\text{Thermal shrinkage ratio (\%)} = \frac{\text{(Dimension before thermal shrinkage)} - \text{(Dimension after thermal shrinkage)}}{\text{Dimension before thermal shrinkage}} \times 100$$

[Heat Deformation Temperature]

A test sample film having a width of 5 mm and a length of 20 mm was placed in a thermomechanical analyzer (TMA). While applying a tensile load of 1 g to both ends of the test sample, temperature was raised from room temperature with a heating rate of 5° C./minute until rupture of the film occurred. The temperature at which rapid expansion (elongation) of the film occurred was recorded as a heat distortion temperature. Specifically, the heat distortion temperature was determined as a temperature of an intersection of a tangent line to a base line on low temperature side and a tangent line to a base line on high temperature side of temperature-deformation curve.

[Internal Strain]

Length of a test sample film before the heating and length of the test sample film after the heating were measured using a two-dimensional length measurement apparatus, and internal strain of the film was calculated according to the following formula.

$$\text{Internal strain}(\%) = (\text{Length after heating} - \text{Length before heating})/\text{Length after heating} \times 100$$

[Film Thickness]

Thicknesses of an obtained film were measured at intervals of 1 cm in the TD direction using a digital thickness meter (manufactured by Mitutoyo Corporation), and the film thickness was determined as an average thicknesses of 10 points arbitrarily selected from a center portion and end portion.

[Surface Roughness of Copper Foil]

The surface roughness (Rz) of a copper foil was measured at a measurement magnification of 1000 by using a profile measuring microscope (manufactured by Keyence Corporation, type: VK-810). The measurement was conducted by a method in accordance with JIS B0601-1994. The surface roughness (Rz) is expressed as a difference in μm between an average value of altitudes of five tops of mountains (peaks of convex portions) that were selected from the highest top to the fifth tops in order of height and an average value of altitudes of five bottoms of valleys (base points of concave portions) that were selected from the deepest valley to the fifth valley in order of depth. That is, the surface roughness (Rz) shows a 10-points average roughness.

[Dielectric Properties]

Measurement of a dielectric constant was conducted at a frequency of 1 GHz according to a resonant perturbation method. A 1-GHz cavity resonator (manufactured by Kanto Electronic Application and Development Inc.) was connected to a network analyzer ("E8362B", manufactured by Agilent Technologies, Inc.), and a small material (width: 2.7 mm×length: 45 mm) was inserted into the cavity resonator, and then, the dielectric constant and the dielectric loss tangent of the material were measured from the change in resonance frequency before and after inserting the material to expose the material to an environment of a temperature of 20° C. and a humidity of 65% (RH) for 96 hours.

[Bond Strength]

A test piece for peel-testing having a width of 1.0 cm was produced from a laminate made of a liquid crystal polymer film and a metal layer. The liquid crystal polymer film was then fixed to a flat plate by a double-sided adhesive tape, and the bond strength (kN/m) when the liquid crystal polymer film and the metal layer of the laminate was peeled from each other at a rate of 50 mm/min was measured using a 180° method in accordance with JIS C 5016.

Example 1

A thermoplastic liquid crystal polyester [VECTRA A950 (trade name), manufactured by Polyplastics Co., Ltd.] was heated and kneaded by a single screw extruder, and melt-extruded at a die shear velocity of 1000 sec$^{-1}$ from an annular inflation die having a die diameter of 33.5 mm and a die slit gap of 500 μm (a first step). After that, the extruded product was drawn so that a ratio (Br/Dr) of a drawing ratio in a TD direction (or Br) to a drawing ratio in a MD direction (or Dr) is 3 (a second step). Subsequently, the obtained raw film (having a melting point of 280° C.) has thermally shrunk by 2% by heating the film under tensile force in a hot-air drying furnace set at 260° C. (a third step). The thermoplastic liquid crystal polymer film was then thermally adhered with an aluminum foil having a thickness of 50 μm to form a composite. A thermal expansion coefficient of the complex was changed to 18×10$^{-6}$ cm/cm/° C. by heating the composite for 30 seconds in a hot-air furnace set at 270° C. Then, the composite was placed in a hot-air circulated heat treatment furnace set at 270° C. (Tm−10° C. of the original film) for 10 hours to increase a heat distortion temperature of the thermoplastic liquid crystal polymer film by 60° C. (a fourth step). The film was delaminated from the support body, and then, the film was fed into a hot-air circulated heat treatment furnace having a furnace length of 1 m set at 200° C. (Td−60° C. of the raw film) at a feeding rate of 1 m/min to conduct heat treatment of the film to remove 1% of internal strain (a fifth step). The obtained film had a relative dielectric constant of 3.3 measured at a frequency in a range of 1 to 100 GHz.

Example 2

A thermoplastic liquid crystal polyester [VECTRA A950 (trade name), manufactured by Polyplastics Co., Ltd.] was heated and kneaded by a single screw extruder, and melt-extruded at a shear velocity (die-shear velocity) of 2000 sec$^{-1}$ from an annular inflation die having a die diameter of 33.5 mm and a die slit gap of 350 μm (a first step). Then, the extruded product was drawn so that a ratio (Br/Dr) of a drawing ratio in a TD direction (or Br) to a drawing ratio in a MD direction (or Dr) was 4 (a second step). Then, the obtained raw film (having a melting point of 280° C.) was thermally shrunk by 3% by heating the film under tensile force in a hot-air drying furnace set at 260° C. (a third step). The thermoplastic liquid crystal polymer film was once thermally adhered with an aluminum foil having a thickness of 50 μm to form a composite. A thermal expansion coefficient of the composite was changed to 10×10$^{-6}$ cm/cm/° C. by heating the composite for 10 seconds in a hot-air furnace set at 270° C. Then, the composite was placed in a hot-air circulated heat treatment furnace set at 260° C. (Tm−20° C. of the original film) for 8 hours to increase a heat distortion temperature of the thermoplastic liquid crystal polymer film by 40° C. (a fourth step). The film was delaminated from the support body, and then, the film was fed into a hot-air circulated heat treatment furnace having a furnace length of 1 m set at 230° C. (Td−30° C. of the original film) at a feeding rate of 1 m/min to conduct a heat treatment to remove 2% of internal strain (a fifth step). The obtained film had a relative dielectric constant of 3.1 measured at a frequency in a range of 1 to 100 GHz.

Comparative Example 1

A thermoplastic liquid crystal polyester [VECTRA A950 (trade name), manufactured by Polyplastics Co., Ltd.] was heated and kneaded by a single screw extruder, and melt-extruded at a shear velocity of 1000 sec$^{-1}$ from an annular inflation die having a die diameter of 33.5 mm and a die slit gap of 500 μm (a first step). Then, the extruded product was drawn so that a ratio (Br/Dr) of a drawing ratio in a TD direction (or Br) to a drawing ratio in a MD direction (or Dr) was 3 (a second step). Subsequently, the obtained raw film (having a melting point of 280° C.) was thermally shrunk by 1% by heating the film under tensile force in a hot-air drying furnace set at 260° C. (a third step). In addition, the thermoplastic liquid crystal polymer film was once thermally adhered with an aluminum foil having a thickness of 50 μm to form a composite, and a thermal expansion coefficient of the composite was changed to 10×10$^{-6}$ cm/cm/° C. by heating the composite for 30 seconds in a hot-air furnace controlled at 260° C. The obtained film had a relative dielectric constant of 3.0 measured at a frequency in a range of 1 to 100 GHz.

Comparative Example 2

A thermoplastic liquid crystal polyester [VECTRA C950 (trade name), manufactured by Polyplastics Co., Ltd.] was heated and kneaded by a single screw extruder, and melt-extruded at a shear velocity of 1000 sec$^{-1}$ from an annular inflation die having a die diameter of 33.5 mm and a die slit gap of 400 μm (a first step). Then, the extruded product was drawn so that a ratio (Br/Dr) of a drawing ratio in a TD direction (or Br) to a drawing ratio in a MD direction (or Dr) was 3 (a second step). Subsequently, the obtained raw film (having a melting point of 320° C.) was thermally shrunk by 1% by heating the film under tensile force in a hot-air drying furnace set at 270° C. (a third step). The thermoplastic liquid crystal polymer film was once thermally adhered with an aluminum foil having a thickness of 50 μm to form a composite, and a thermal expansion coefficient of the composite was changed to 10×10$^{-6}$ cm/cm/° C. by heating the composite in a hot-air furnace set at 280° C. for 30 seconds. Then, the composite was placed in a hot-air circulated heat treatment furnace set at 280° C. (Tm−40° C. of the original film) for 6 hours to increase a heat distortion temperature of the thermoplastic liquid crystal polymer film by 40° C. (a fourth step). The obtained film had a relative dielectric constant of 3.2 measured at a frequency in a range of 1 to 100 GHz.

Each of the films obtained in Examples and Comparative Examples was once heated at the melting point of the film for 60 minutes and the relative dielectric constant and the dielectric loss tangent thereof were measured at a temperature in a range of −100° C. to 100° C. The heated film was once left to stand under conditions of 25° C., 50% RH and 85° C., 85% RH for 96 hours in each condition, and then the relative dielectric constant and the dielectric loss tangent of the film after left to stand were measured. Physical properties of the films obtained in Examples and Comparative Examples are shown in Table 7.

TABLE 7

| | | | −100 to 100° C. | | 25° C., 50% RH to 85° C., 85% RH | |
|---|---|---|---|---|---|---|
| | Material | Change of relative dielectric constant after heating (%) | Relative dielectric constant | Dielectric loss tangent | Relative dielectric constant | Dielectric loss tangent |
| Example 1 | A | 1 | 3.3 | 0.002 | 3.4 | 0.008 |
| Example 2 | B | 4 | 3.2 | 0.004 | 3.4 | 0.009 |

TABLE 7-continued

| | | | | | | |
|---|---|---|---|---|---|---|
| Comparative Example 1 | C | 10 | 3.3 | 0.015 | 3.4 | 0.015 |
| Comparative Example 2 | D | 20 | 3.7 | 0.010 | 3.8 | 0.020 |

[Material]

| Material | Raw material polymer | First step Shear rate (/sec) | Second step Drawing ratio (Transverse/Longitudinal) | Third step Thermal shrinkage rate (%) | Fourth step Heat distortion temperature (° C.) | Fifth step Removed internal strain (%) | Relative dielectric constant (1-100 GHz) |
|---|---|---|---|---|---|---|---|
| A | VECTRA A | 1000 | 3 | 2 | 320 | 1 | 3.3 |
| B | VECTRA A | 2000 | 4 | 3 | 300 | 2 | 3.1 |
| C | VECTRA A | 500 | 3 | 1 | 260 | 0 | 3.0 |
| D | VECTRA C | 1000 | 3 | 1 | 300 | 0 | 3.2 |

As shown in Table 7, the relative dielectric constants of the thermoplastic liquid crystal polymer films in Examples 1 and 2 are hardly changed before and after heating. On the contrary, in the thermoplastic liquid crystal polymer films in Comparative Examples 1 and 2, relative dielectric constants after heating are significantly changed compared with the relative dielectric constants before heating. In addition, the films in Examples 1 and 2 retain low relative dielectric constants and dielectric loss tangents in a wide temperature region and under high temperature and high humidity conditions even after heating, whereas, in the films in Comparative Examples 1 and 2, relative dielectric constants and dielectric loss tangents after heating increase. In addition, these dielectric properties of the films in Comparative Examples 1 and 2 are further worsened under the high temperature and high humidity conditions.

Example 3

Copper foils having a thickness of 18 μm (a surface roughness of the copper film of 3 μm) were overlaid on both surfaces of the thermoplastic liquid crystal polymer film prepared in Example 1, and were bonded to the film by thermocompression using a vacuum hot press apparatus under conditions of a temperature of 300° C. and a pressure of 30 kg/cm² to produce a metal laminated film made of the thermoplastic liquid crystal polymer film and the copper foils. Then, the film prepared in Example 1 was sandwiched between two metal laminated films as an intermediate sheet to form a board set, and 10 sets of the obtained board sets were placed between heat pressing plates. At the board set side, each of the heat pressing plates had a smooth convex part from an edge part to a center part and a height of the convex part at the center part was about 100 μm.

Figure 1:
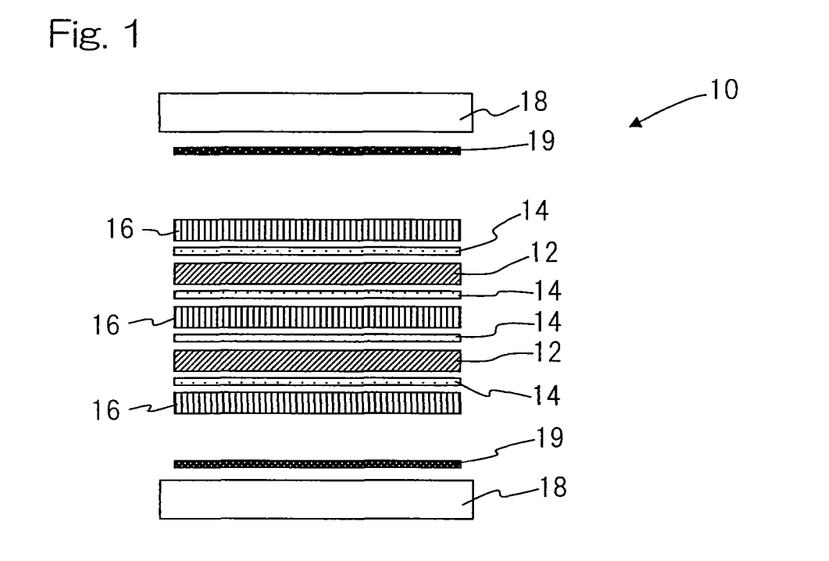
FIG. 1 is a schematic cross-sectional view for illustrating a production process of a laminate of Example 3 in the present invention.

As shown in FIG. 1, each board set 12 was placed in the thermocompression bonding device 10 in a state that each board set 12 was sandwiched, via release materials 14 and cushioning materials 16 disposed outside the board set 12, between heat pressing plates 18, 18. Stainless plates 19, 19 were placed at the side of heat pressing plates so that all board sets are sandwiched between the two stainless plates 19, 19.

The heat pressing plates 18 were heated in this state. As a result, a temperature of the board sets 12 rapidly rose to 295° C. and a plurality of multilayer laminated plates were formed for a total press time of 30 minutes. An interface bond strength of the obtained multilayer laminated plate was 0.8 kN/m.

Comparative Example 3

Figure 2:
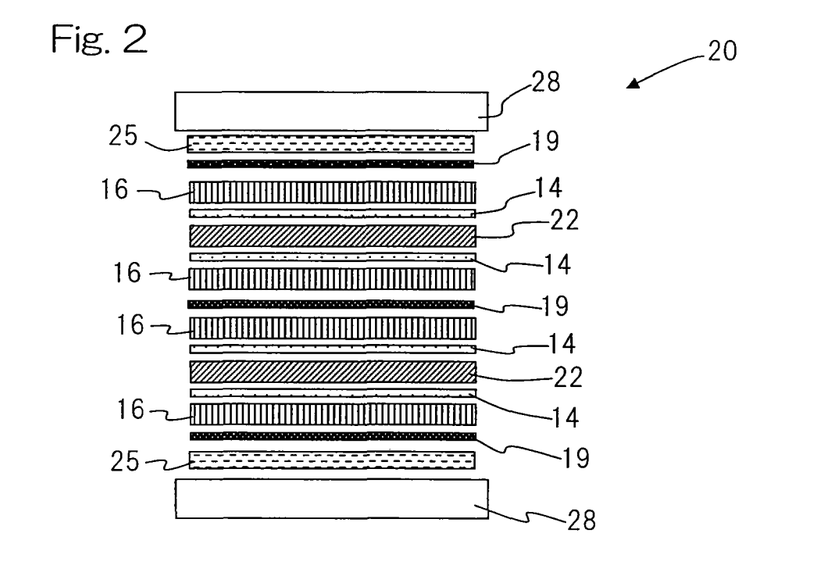
FIG. 2 is a schematic cross-sectional view for illustrating a production process of a laminate of Comparative Example 3 in the present invention.

The same number of board sets as those of the Example 3 were prepared in a similar manner to Example 3 except that the thermoplastic liquid crystal polymer film of Comparative Example 1 was used as the thermoplastic liquid crystal polymer film. Then, as shown in FIG. 2, each board set 22 was placed in the thermocompression bonding device 20 in a state that each board set 22 was sandwiched, via the release materials 14, the cushioning materials 16, and stainless plates 19 disposed outside the board set, between the heat pressing plates 28, 28. The heat pressing plates 28 did not have microconvex parts.

In this thermocompression bonding device, press pads 25 for correcting distortion of copper foils were placed at the side of heat pressing plates such that the whole board sets were sandwiched by the two press pads 25. Further, stainless plates 19 were inserted between cushioning materials 16 disposed between each two of the board sets, and stainless plates 19 were disposed on the side of the cushioning materials 16 on both sides in order to correct distortion of the copper foils.

The heat pressing plates 28 were heated in this state. It took long time to raise temperature of the board sets 22 to 295° C. because Comparative Example 3 was different from Example 3 in that not only the stainless plates inserted between each board sets but also the press pads were required. A total press time for forming a plurality of multilayer laminated plates was 120 minutes. An interface bond strength of the obtained multilayer laminated plate was 0.8 kN/m.

The relative dielectric constants and the dielectric loss tangents of the multilayer laminated plates obtained in Example 3 and Comparative Example 3 were measured in a range of −100° C. to 100° C. In addition, the multilayer laminated plates were once left to stand under conditions of 25° C., 50% RH and 85° C., 85% RH for 96 hours in each condition. Subsequently, the relative dielectric constants and the dielectric loss tangents of the multilayer laminated plates were measured.

Physical properties of the multilayer laminated plates obtained in Example 3 and Comparative Example 3 are shown in Table 8.

TABLE 8

| | Material | Change of relative dielectric constant after thermocompression bonding of laminate (%) | −100 to 100° C. | | 25° C., 50% RH to 85° C., 85% RH | |
|---|---|---|---|---|---|---|
| | | | Relative dielectric constant | Dielectric loss tangent | Relative dielectric constant | Dielectric loss tangent |
| Example 3 | A | 1 | 3.3 | 0.002 | 3.4 | 0.008 |
| Comparative Example 3 | C | 8 | 3.1 | 0.003 | 3.2 | 0.010 |

As shown in Table 8, the relative dielectric constant of the thermoplastic liquid crystal polymer film in Example 3 is hardly changed before and after heating. In addition, the thermoplastic liquid crystal polymer did not flow out of the multilayer laminated plates even when an ultra-low profile copper foil was used. On the contrary, in the multilayer laminate in Comparative Example 3, the relative dielectric constant after heating is significantly changed compared to the relative dielectric constant before heating. In addition, the thermoplastic liquid crystal polymer flowed out of the multilayer laminated plates due to the use of the ultra-low profile copper foil.

As a Reference Example, the hot pressing was performed in a similar manner as Example 3 except that the thermoplastic liquid crystal polymer film in Comparative Example 1 was used instead of the thermoplastic liquid crystal polymer film in Example 1. It was possible to produce a multilayered laminated plate efficiently while avoiding flow out of the multilayered laminated plate even though ultra-low profile copper foils were used.

INDUSTRIAL APPLICABILITY

The thermoplastic liquid crystal polymer film of the present invention can be used as a board material for electric and electronic products. In addition, according to the present invention, the board set including the thermoplastic liquid crystal polymer film can be effectively provided.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A liquid crystal polymer film made of a thermoplastic polymer capable of forming an optically anisotropic melt phase (hereinafter, referred to as a thermoplastic liquid crystal polymer film), wherein a change ratio of a relative dielectric constant ($\epsilon_{r2}$) of the film after heating of the film to a relative dielectric constant ($\epsilon_{r1}$) of the film before the heating satisfies the following formula (I) where the film is heated for 1 hour at the melting point of the film, $$|\epsilon_{r2} - \epsilon_{r1}|/\epsilon_{r1} \times 100 \leq 5 \quad (I)$$

where $\epsilon_{r1}$ denotes the relative dielectric constant of the film before the heating, $\epsilon_{r2}$ denotes the relative dielectric constant of the film after the heating, and these relative dielectric constants are measured at the same frequency in a range of 1 to 100 GHz.

2. The liquid crystal polymer film according to claim 1, wherein the relative dielectric constant ($\epsilon_{r2}$) of the film after the heating is 2.6 to 3.5 and a dielectric loss tangent (Tan $\delta_2$) of the film is 0.001 to 0.01.

3. The liquid crystal polymer film according to claim 1, wherein the relative dielectric constant ($\epsilon_{r2}$) of the film after the heating is 2.6 to 3.5 and the dielectric loss tangent (Tan $\delta_2$) of the film is 0.001 to 0.01 at a temperature in a range from −100° C. to 100° C.

4. The liquid crystal polymer film according to claim 1, wherein the relative dielectric constant ($\epsilon_{r2}$) of the film after the heating is 2.6 to 3.5 and dielectric loss tangent (Tan $\delta_2$) of the film is 0.001 to 0.01 after exposing the film after the heating to conditions of 25° C., 50% RH and 85° C., 85% RH.

5. A laminate comprising at least one film layer made of the thermoplastic liquid crystal polymer film recited in claim 1 and at least one metal layer, wherein the laminate has a laminated structure in which the film layer and the metal layer are laminated alternately.

6. The laminate according to claim 5, wherein a surface roughness of the metal layer is 1/50 or less of a thickness of the thermoplastic liquid crystal polymer film.

7. A circuit board at least comprising the thermoplastic liquid crystal polymer film recited in claim 1 and a conductor circuit layer formed on at least one surface of the thermoplastic liquid crystal polymer film.

8. The circuit board according to claim 7, wherein the circuit board comprises a plurality of conductor circuit layers.

9. A method of producing a laminate, comprising:
(i) preparing a metal laminated film in which a metal layer is thermocompressively bonded to at least one surface of the liquid crystal polymer film recited in claim 1;
(ii) preparing at least one set of a board set in which
 a plurality of the metal laminated films are overlaid such that the metal layer and the polymer film layer are alternately laminated, or
 at least one metal laminated film and at least one thermoplastic liquid crystal polymer film are overlaid such that the metal layer and the polymer film layer are alternately laminated; and
 loading the board set between two heat pressing plates opposed to each other; and
(iii) heating the heat pressing plates to bond the layers of the loaded board set by thermocompression bonding, wherein the heat pressing plates have a microconvex part for absorbing thermal expansion of the metal layer.

10. The method of producing laminate according to claim 9, wherein the microconvex part formed in each of the heat pressing plates increases its height from the edge of the plate to a center of the plate and has a height of 10 to 500 μm at the center of the plate.

11. A method of producing the thermoplastic liquid crystal polymer film according to claim 1, the method comprising:
 (I) performing melt extrusion of a thermoplastic liquid crystal polymer while controlling a shear velocity of the thermoplastic liquid crystal polymer in a die region to be $200\text{sec}^{-1}$ or higher during extruding a melt of the polymer through the die;
 (II) drawing the extruded polymer to obtain a raw film while controlling a ratio (Br/Dr) of drawing ratio (blow ratio: Br) of the polymer in transverse direction (TD direction) to drawing ratio (draw ratio: Dr) of the polymer in machine direction (MD direction) to be 1.5 to 5;
 (III) heat-shrinking the raw film after the extrusion and drawing steps by 1.5% or more under a presence of tensile force;
 (IV) laminating the heat-shrunk film on a support body to form a composite to control a thermal expansion coefficient of the film, and subsequently heat treating the composite at a temperature ranging from a temperature (Tm−10° C.) being 10° C. lower than a melting point (Tim) of the film to a temperature (Tm+10° C.) being 10° C. higher than the melting point of the film to increase a heat distortion temperature (Td) of the film; and
 (V) performing annealing of the film delaminated from the support body after the heat treatment, the annealing being performed by heating the film at a temperature in a range from a temperature being 80° C. lower than the heat distortion temperature (Td) of the raw film, i.e., (Td−80)° C. to a temperature being 10° C. lower than Td, i.e., (Td−10)° C.

12. The liquid crystal polymer film according to claim 1, wherein $|\epsilon_{r2}-\epsilon_{r1}|/\epsilon_{r1}\times 100\leq 4$.

13. The liquid crystal polymer film according to claim 1, wherein $|\epsilon_{r2}-\epsilon_{r1}|/\epsilon_{r1}\times 100\leq 1$.

14. The liquid crystal polymer film according to claim 1, wherein $1\leq[|\epsilon_{r2}-\epsilon_{r1}|/\epsilon_{r1}\times 100]\leq 5$.

* * * * *